United States Patent
Brown et al.

(10) Patent No.: US 7,821,117 B2
(45) Date of Patent: Oct. 26, 2010

(54) SEMICONDUCTOR PACKAGE WITH MECHANICAL STRESS ISOLATION OF SEMICONDUCTOR DIE SUBASSEMBLY

(75) Inventors: Clem H. Brown, Scottsdale, AZ (US); Vasile R. Thompson, Tempe, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 128 days.

(21) Appl. No.: 12/104,283

(22) Filed: Apr. 16, 2008

(65) Prior Publication Data

US 2009/0261482 A1    Oct. 22, 2009

(51) Int. Cl.
*H01L 23/16* (2006.01)
*H01L 21/56* (2006.01)

(52) U.S. Cl. ............... 257/678; 257/E23.135; 257/E21.504; 257/783; 257/676; 257/680; 257/668; 257/784; 257/786; 257/684; 257/796

(58) Field of Classification Search .......... 257/E23.135, 257/E21.504, 783, 678, 676, 680, 668, 784, 257/786, 684, 796
See application file for complete search history.

(56) References Cited

U.S. PATENT DOCUMENTS

| | | | |
|---|---|---|---|
| 3,748,501 A * | 7/1973 | Fritzsche et al. ............ 327/574 |
| 3,750,269 A | 8/1973 | Small |
| 4,993,148 A | 2/1991 | Adachi et al. |
| 5,048,179 A | 9/1991 | Shindo et al. |
| 5,263,245 A | 11/1993 | Patel et al. |
| 5,779,134 A | 7/1998 | Watson et al. |
| 6,072,038 A | 6/2000 | Sessler et al. |
| 6,190,941 B1 | 2/2001 | Heinz et al. |
| 6,200,407 B1 | 3/2001 | Wieloch et al. |
| 6,923,658 B2 * | 8/2005 | Cromwell et al. ............. 439/71 |
| 6,946,744 B2 | 9/2005 | Maxwell et al. |
| 7,064,963 B2 * | 6/2006 | Oman et al. ................. 361/792 |
| 7,442,049 B2 * | 10/2008 | Hougham et al. ............. 439/71 |
| 2004/0212054 A1 | 10/2004 | Maxwell et al. |
| 2004/0212073 A1 | 10/2004 | Divakar et al. |
| 2005/0218505 A1 * | 10/2005 | Oman et al. ................. 257/702 |
| 2007/0004239 A1 * | 1/2007 | Hougham et al. ............. 439/66 |

FOREIGN PATENT DOCUMENTS

WO  PCT/US2004/014209    11/2004

* cited by examiner

*Primary Examiner*—Alexander O Williams
(74) *Attorney, Agent, or Firm*—Meschkow & Gresham, P.L.C.

(57) ABSTRACT

A semiconductor package (20) includes an organic substrate (24) and a semiconductor die subassembly (22). A method (50) for making the semiconductor package (20) entails providing (52) the organic substrate (24) having an opening (26) and electrical contacts (36). The subassembly (22) is formed by producing (64) a semiconductor die (28) and bonding it to a platform layer (30). An elastomeric adhesive (38) is utilized (92) to secure the subassembly (22) in the opening (26). Electrical interconnects (32) are provided (106) between the semiconductor die (28) and the electrical contacts (36) of the organic substrate (24). The organic substrate (24), semiconductor die (28), elastomeric adhesive (38), and electrical interconnects (32) are encapsulated (114) in a packaging material (46). The elastomeric adhesive (38) provides mechanical anchoring of the subassembly (22) to the substrate (24) and provides mechanical stress isolation of the semiconductor die (28) within the semiconductor package (20).

15 Claims, 4 Drawing Sheets

SEMICONDUCTOR PACKAGE WITH MECHANICAL STRESS ISOLATION OF SEMICONDUCTOR DIE SUBASSEMBLY

TECHNICAL FIELD OF THE INVENTION

The present invention relates generally to semiconductor packages. More specifically, the present invention relates to a semiconductor package and method of making the semiconductor package using low cost materials.

BACKGROUND OF THE INVENTION

Semiconductor devices are electronic components that exploit the electronic properties of semiconductor materials, principally silicon, germanium, and gallium arsenide. Semiconductor devices are manufactured both as single discrete devices and as integrated circuits (ICs), which include a quantity, from a few to millions, of devices manufactured and interconnected on a single semiconductor substrate. A semiconductor package can include one or more metal leadframes, one or more semiconductor die attached to a die pad of the leadframe, bonding wires which electrically connect pads on the die to individual leads of the leadframe, and a hard plastic packaging material, or encapsulant, which covers the other components and forms the exterior of the packaged electronic device. The packaging material, or encapsulant, provides protection from hostile environments.

Power semiconductor devices are discrete devices or integrated circuits intended for high current or high voltage applications. Due to relatively large current conduction, power semiconductor devices heat up during operation. Unfortunately, semiconductors do not perform well at elevated temperatures. Therefore, a power semiconductor device needs to be cooled by removing that heat continuously. Accordingly, a power semiconductor device is typically attached to a platform layer or heat sink to remove the heat caused by operation losses. This heat is subsequently carried outside of the power semiconductor device.

Semiconductor devices, including power semiconductor devices, continue to shrink in physical size and expand in functionality. Unfortunately, leadframe technology has in many instances reached its theoretical limits in terms of lead pitch and density. Consequently, a need has arisen for increased capability in terms of having a greater amount of electrical interconnects than that afforded by leadframe technology.

Organic substrate materials provide a means to increase circuit density over leadframe technology. However, organic substrate materials cannot withstand the high temperatures encountered during processing, such as the high temperature required for fabrication of semiconductor devices, for attachment of a power semiconductor die to a heat sink platform, and the like. Nor can organic substrate materials adequately dissipate the heat generated by a power semiconductor device. Thus, what is needed is a technique for effectively increasing circuit density of a semiconductor device, such as a power semiconductor die, that is able to withstand high processing temperatures and effectively dissipate generated heat.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
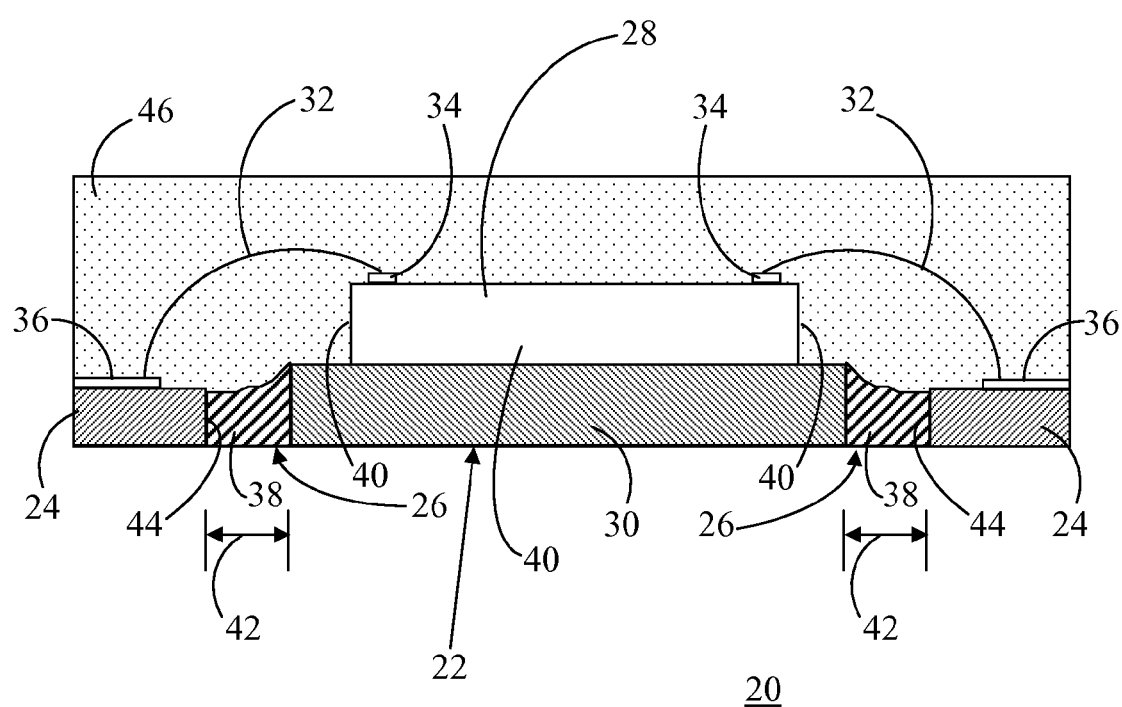
FIG. 1 shows cross-sectional side view of a semiconductor package in accordance with an embodiment of the present invention.

FIG. 1 shows cross-sectional side view of a semiconductor package 20 in accordance with an embodiment of the present invention. Semiconductor package 20 includes a semiconductor die subassembly 22 integrated into an organic substrate 24. In particular, organic substrate 24 has an opening 26 in which semiconductor die subassembly 22 is positioned. Semiconductor die subassembly 22 includes a semiconductor die 28 bonded to an underlying platform layer 30. Electrical interconnects 32, e.g., bonding wires, connect pads 34 of semiconductor die 28 to electrical contacts 36 formed in organic substrate 24.

An elastomeric adhesive 38 secures semiconductor die subassembly 22 in opening 26 of organic substrate 24. In one embodiment, opening 26 is larger than an outer perimeter 40 of semiconductor die subassembly 22. Accordingly, a gap 42 is formed between an edge 44 of organic substrate 24 and perimeter 40 of semiconductor die subassembly 22. Gap 42 is sealed with elastomeric adhesive 38. A packaging material 46 encapsulates semiconductor die subassembly 22, organic substrate 24, electrical interconnects 32, and elastomeric adhesive 38.

The term "elastomeric" utilized herein refers to a material or composite that is generally capable of recovering its shape after deformation when the deforming force is removed. In general, elastomeric adhesive 38 may be characterized by a low modulus of elasticity, high thermal resistance, and high tensile flexibility. In one embodiment, elastomeric adhesive 38 may be a silicone-based adhesive material. During assembly, the elements of semiconductor package 20 may be subjected to physical stresses. The physical stress attributes of semiconductor die subassembly 22 are in opposition to organic substrate 24 and packaging material 46. Elastomeric adhesive 38 mitigates the physical stresses between the dissimilar materials of semiconductor die subassembly 22, organic substrate 24, and packaging material 46 by allowing limited movement of semiconductor die subassembly 22.

Organic substrate 24 is generally a material that contains carbon and hydrogen, and usually other elements such as nitrogen, sulfur, and oxygen. A printed circuit board is an example of an organic substrate 24 because the laminate material of a printed circuit board is made of glass fibers in an epoxy, and epoxies are carbon based. Thus, organic substrate 24 may be a printed circuit board. Organic substrate 24, in the form of a printed circuit board, can be used to mechanically support and electrically connect electronic components using conductive pathways, or traces etched from copper sheets laminated onto a non-conductive substrate. In one embodiment, organic substrate 24 mechanically supports semiconductor die subassembly 22 via elastomeric adhesive 38, and electrical contacts 36 in organic substrate 24 represent the conductive traces formed in organic substrate 24 that provide electrical interconnection with semiconductor die 28 via electrical interconnects 32.

In one embodiment, semiconductor die 28 is a power semiconductor die that heats up during operation. Consequently, platform layer 30 may be a metal layer, such as copper, that functions as a heat sink to efficiently transfer thermal energy, i.e. heat, from semiconductor die 28 to metal platform layer 30. This transfer of thermal energy brings semiconductor die 28 into thermal equilibrium with platform layer 30, thus lowering the temperature of semiconductor die 28. Although a power semiconductor die is discussed herein, in other embodiments, semiconductor die 28 may be other semiconductor components or integrated circuits that generate heat, for which heat dissipation is required, and/or that calls for very low electrical resistance. In addition, although semiconductor die package 20 is shown with only one semiconductor die subassembly 22, it should be understood that a single package 20 may include more than one semiconductor die subassembly 22.

Figure 2:
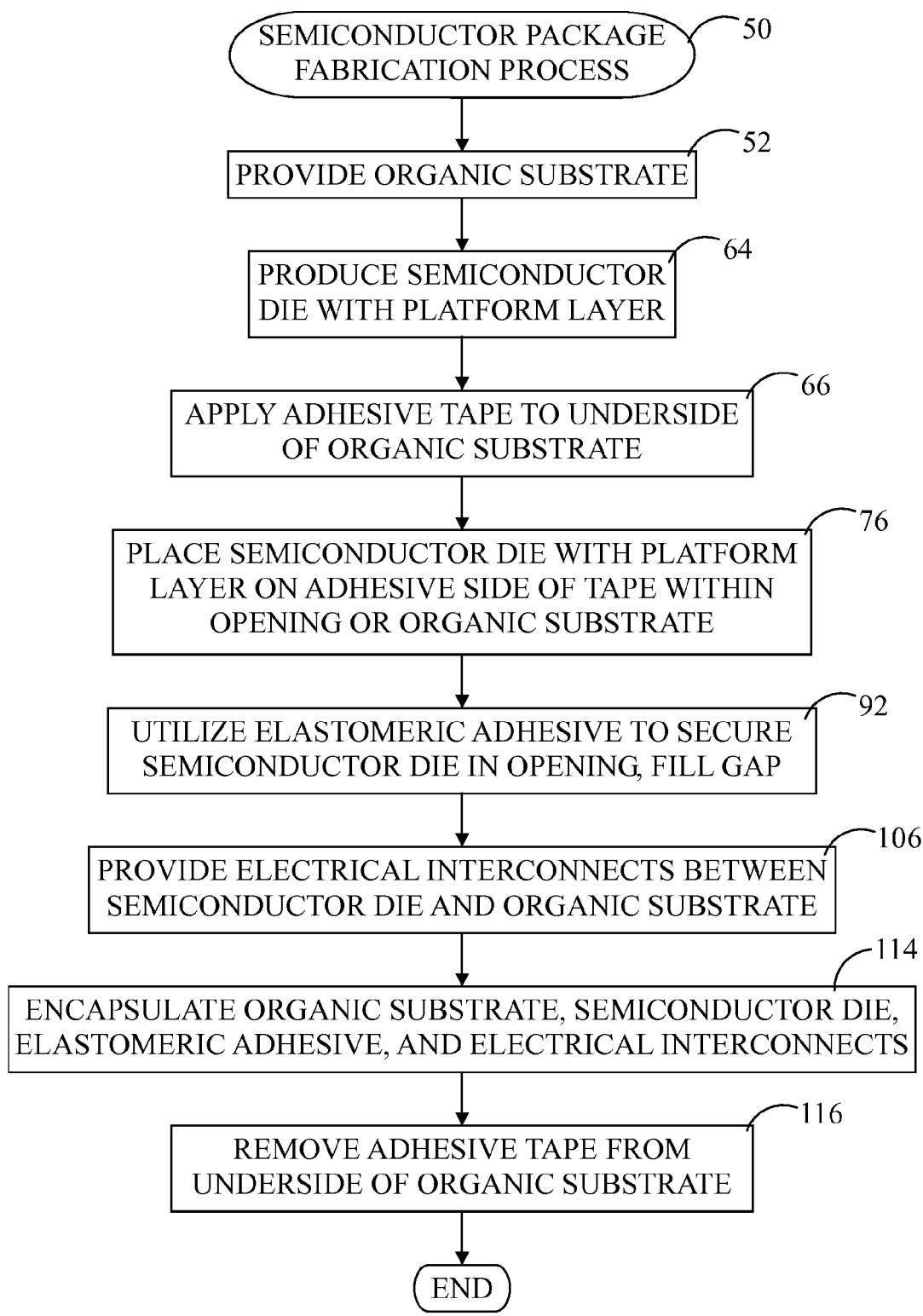
FIG. 2 shows a flowchart of a semiconductor fabrication process in accordance with another embodiment of the present invention.

FIG. 2 shows a flowchart of a semiconductor fabrication process 50 in accordance with another embodiment of the present invention. Semiconductor fabrication process 50 combines the features of semiconductor device fabrication techniques and lower cost organic substrate processing techniques to form a semiconductor package 20, such as a power semiconductor device. Thus, process 50 is performed to yield the integrated structure of semiconductor die subassembly 22 with organic substrate 24.

Semiconductor fabrication process 50 is described below in connection with the fabrication of a single semiconductor package 20 for simplicity of illustration. However, it should be understood by those skilled in the art that the following process allows for concurrent manufacturing of a plurality of semiconductor package 20. For example, multiple semiconductor dies 28 may undergo concurrent semiconductor device fabrication on a wafer. The individual semiconductor dies 28 can then be cut, or diced, in a conventional manner to provide individual semiconductor dies 28 that can be bonded to a plurality of platform layers 30 to form subassemblies 22. These semiconductor die subassemblies 22 can then be secured to a plurality of organic substrates 24 and undergo the remainder of the fabrication process.

Process 50 begins with a task 52. At task 52, organic substrate 24 (FIG. 1) is formed, i.e., fabricated. As mentioned briefly above, organic substrate 24 may be a printed circuit board. Accordingly, fabrication may entail various process steps of printed circuit board manufacturing. These process steps may include the creation of opening 26 by etching, drilling, punching, and so forth. These process steps may also include patterning and etching, lamination to produce electrical contacts 36, exposed conductor plating and coating, solder resist, screen printing, test, populating with electrical circuits, and so forth.

Figure 3:
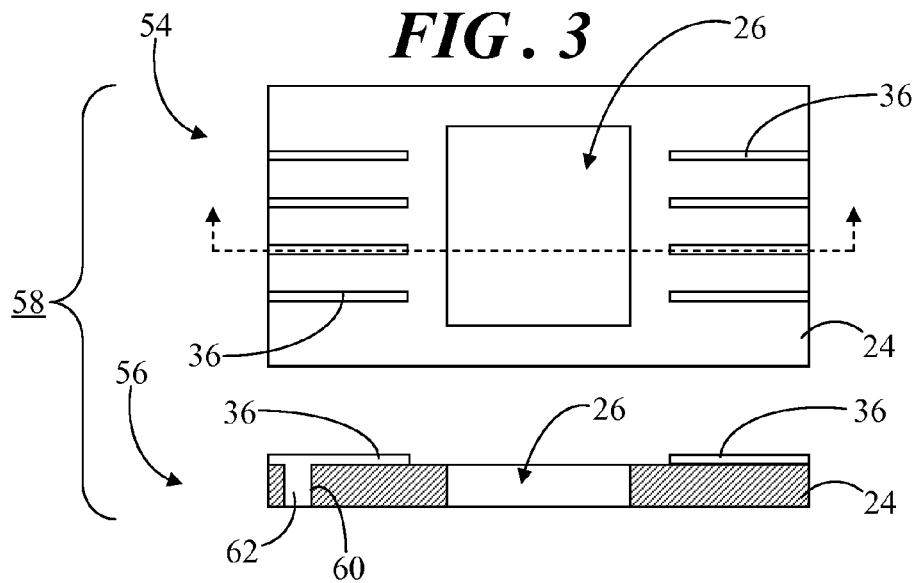
FIG. 3 shows a top view and a side view of the device of FIG. 1 in a beginning stage of processing.

Referring to FIG. 3 in connection with task 52 of fabrication process 50, FIG. 3 shows a top view 54 and a side view 56 of the device of FIG. 1 in a beginning stage 58 of processing. At beginning stage 58, organic substrate 24 is provided. Organic substrate 24 includes opening 26 and electrical contacts 36. The laminate structure of organic substrate 24 enables the creation of electrical connection paths on both sides of organic substrate 24. Thus organic substrate 24 may include vias 60, of which one is shown, filled with a conductive material 62 that connects one side of organic substrate 24 to the other. The term "providing" refers to acquiring organic substrate 24 from a different manufacturing facility, fabricating all or a portion of organic substrate 24 at the facility that is fabricating semiconductor package 20, and/or otherwise being provided with organic substrate for incorporation into semiconductor package 20.

Referring back to FIG. 2, fabrication process 50 continues with a task 64. At task 64, semiconductor die subassembly 22 (FIG. 1) is produced. The term "producing" refers to acquiring subassembly 22 from a different manufacturing facility, fabricating all or a portion of subassembly 22 at the facility that is fabricating semiconductor package 20, and/or otherwise being provided with semiconductor die subassembly 22 for incorporation into semiconductor package 20.

Semiconductor die 28 may be manufactured utilizing a semiconductor device fabrication process. In semiconductor device fabrication, semiconductor dies or chips are fabricated in a multiple-step sequence of photographic and chemical processing steps during which the electronic circuit is gradually created on a wafer made of pure semiconductor material. Following wafer testing, the wafer is separated into individual semiconductor dies. The semiconductor dies subsequently undergo plastic or ceramic packaging. Following fabrication of semiconductor die 28, semiconductor die 28 is bonded to platform layer 30 using a high temperature bonding process, for example, high temperature metal solder, to form semiconductor die subassembly 22. It should be noted that task 52 pertains to using organic substrate processing techniques, such as printed circuit board fabrication techniques, and task 64 pertains to using semiconductor device fabrication techniques. Accordingly, although tasks 52 and 64 are described herein as being serial operations for simplicity, these distinct processes may be performed in parallel in separate areas of a single manufacturing facility or these distinct processes may be performed at different manufacturing facilities.

Following fabrication tasks 52 and 64, a task 66 is performed. At task 66, a single-sided adhesive tape is applied to the underside of organic substrate 24.

Figure 4:
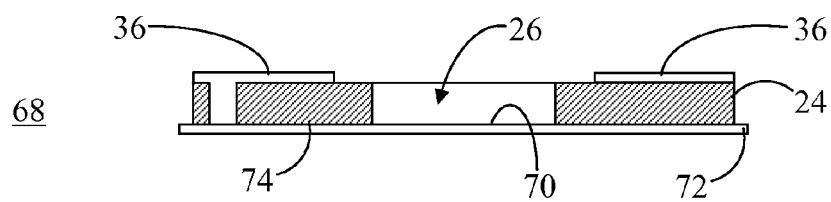
FIG. 4 shows a side view of the device of FIG. 3 in a subsequent stage of processing.

Referring to FIG. 4 in connection with task 66, FIG. 4 shows a side view of the device of FIG. 3 in a subsequent stage 68 of processing. In particular, the side view of the device at stage 68 shows an adhesive side 70 of an adhesive tape 72 adhered to an underside 74 of organic substrate 24. Thus, adhesive side 70 of adhesive tape 72 is positioned in opening 26. In one embodiment, adhesive tape 72 is an electronic grade, single-sided adhesive tape, such as a polyimide thermal resist masking tape, that remains stable in a wide range of temperatures. Consequently, adhesive side 70 of tape 72 will remain secured to underside 74 of organic substrate 24 at conventional elevated processing temperatures, such as during subsequent wire bonding activities (discussed below).

Referring back to FIG. 2, fabrication process 50 continues with a task 76. At task 76, semiconductor die subassembly 22 is placed in opening 26 of organic substrate 24 and is at least temporarily secured to adhesive tape 72. That is, semiconductor die subassembly 22 is secured in opening 26 of organic substrate 24 following the high temperature processing operations of the semiconductor device fabrication process at task 64.

Figure 5:
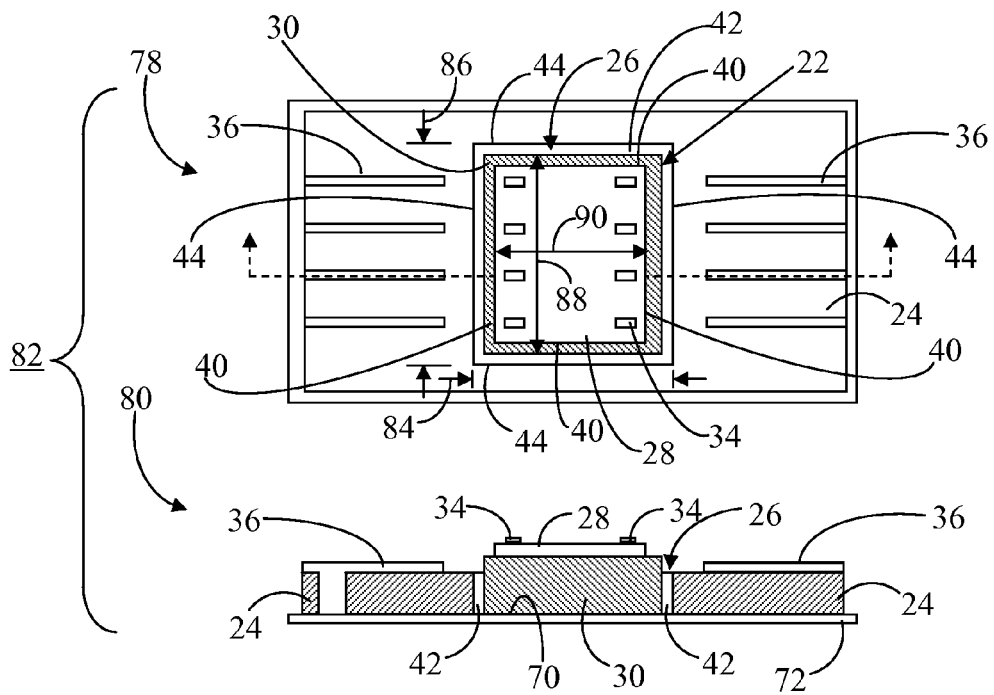
FIG. 5 shows a top view and a side view of the device of FIG. 4 in a subsequent stage of processing.

Referring to FIG. 5 in connection with task 76, FIG. 5 shows a top view 78 and a side view 80 of the device of FIG. 4 in a subsequent stage 82 of processing. In particular, platform layer 30 of semiconductor die subassembly 22 is placed in opening 26 of organic substrate 24 and is temporarily secured to adhesive side 70 of adhesive tape 72. Platform layer 30 is illustrated with downwardly and rightwardly directed hatching in top view 78 and side view 80 to distinguish it from opening 26 and the overlying semiconductor die 28. A size of opening 26, as depicted by a width 84 and a height 86, is larger than a corresponding size of platform layer 30 of semiconductor die subassembly 22, as depicted by a width 88 and a height 90. Thus, gap 42 is formed between edges 44 of opening 26 and outer perimeter 40 of subassembly 22.

With reference back to semiconductor package fabrication process 50 (FIG. 2), a task 92 is performed following placement of semiconductor die subassembly 22 within opening 26 at task 76. At task 92, elastomeric adhesive 38 is utilized to secure semiconductor die subassembly 22 in opening 26.

Figure 6:
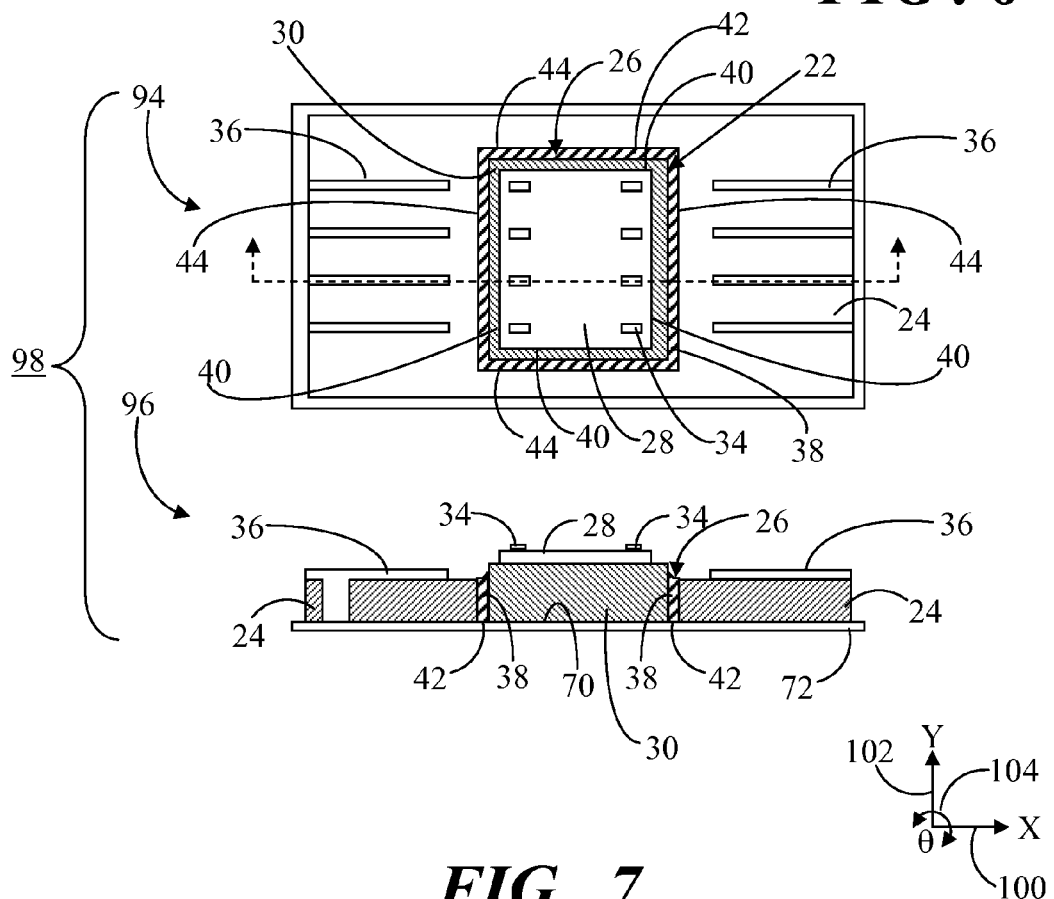
FIG. 6 shows a top view and a side view of the device of FIG. 5 in a subsequent stage of processing.

Referring to FIG. 6 in connection with task 92, FIG. 6 shows a top view 94 and a side view 96 of the device of FIG. 5 in a subsequent stage 98 of processing. As shown, elastomeric adhesive 38 fills gap 42 surrounding platform layer 30 of semiconductor die subassembly 22. The presence of adhesive tape 72 largely prevents a flow of elastomeric adhesive 38 underneath semiconductor die subassembly 22 and/or underneath organic substrate 24.

As mentioned above, elastomeric adhesive 38 is generally capable of recovering its shape after deformation when the deforming force is removed. In this instance, the deforming force is the physical stress between the dissimilar materials of semiconductor die subassembly 22, organic substrate 24, and packaging material 46 (FIG. 1). The use of elastomeric adhesive 38 in gap 42 mechanically anchors semiconductor die subassembly 22 in opening 26 of organic substrate 24 by sealing gap 42 between edge 44 of opening 26 and perimeter 40 of platform layer 30. In addition, the use of elastomeric adhesive 38 allows for limited motion of semiconductor die subassembly 22 in an X-direction 100, a Y-direction 102, and a theta (i.e., rotational) direction 104. If the epoxy packaging material 46 was utilized to fill gap 42 instead of elastomeric adhesive 38, crack propagation would result at the interface of packaging material 46 and subassembly 22 as a result of molding stress. The inclusion of elastomeric adhesive 38 in semiconductor package 20 provides mechanical anchoring and concurrently provides stress mitigation in order to facilitate assembly and maintain integrity of the completed semiconductor package 20.

With reference back to semiconductor package fabrication process 50 (FIG. 2), a task 106 is performed following task 92. At task 106, electrical interconnects 32 are provided between semiconductor die subassembly 22 and organic substrate 24.

Figure 7:
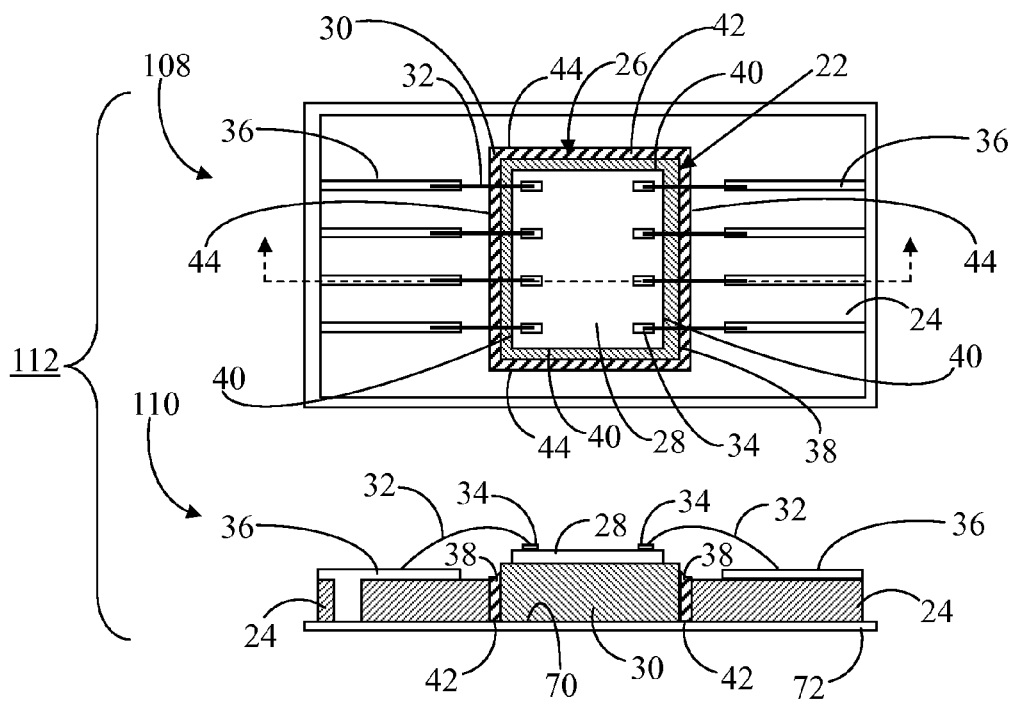
FIG. 7 shows a top view and a side view of the device of FIG. 6 in a subsequent stage

Referring to FIG. 7 in connection with task 106, FIG. 7 shows a top view 108 and a side view 110 of the device of FIG. 6 in a subsequent stage 112 of processing. In the illustrated embodiment, electrical interconnects 32 are bond wires attached to pads 34 of semiconductor die 28 and electrical contacts 36 in organic substrate 24 using a wire bonding process. Thus, wire bonding is utilized to make interconnections between semiconductor die 28 and other electronics (not visible) on organic substrate 24. Elastomeric adhesive 38 in gap 42 as well as the underlying adhesive tape 72 provide mechanical anchoring of semiconductor die subassembly 22 during wire bonding.

With reference back to semiconductor package fabrication process 50 (FIG. 2), a task 114 is performed after electrical interconnects 32 are formed between semiconductor die 28 and organic substrate 24 at task 106. At task 114, organic substrate 24, semiconductor die subassembly 22, elastomeric adhesive 38, and electrical interconnects 32 are encapsulated with packaging material 46, such as an epoxy resin. This stage of processing is shown in FIG. 1.

Following task 114, process 50 continues with a task 116. At task 116, adhesive tape 72 (FIG. 4) is removed from underside 74 (FIG. 4) of organic substrate 24, as well as from elastomeric adhesive 38 and an underside of platform layer 30 of semiconductor die subassembly 22. Once encapsulated, adhesive tape 72 is no longer needed to hold semiconductor die subassembly 22 in the proper position within opening 26 of organic substrate 24. Thus, adhesive tape 72 can be removed and discarded.

Following task 116, semiconductor package fabrication process 50 ends. Of course, fabrication process 50 may include operations subsequent to task 116 and prior to ending that entail, for example, populating organic substrate 24 with additional electronic circuits, singulating the individual semiconductor packages 20, testing and verification, and the like known to those skilled in the art.

An embodiment described herein comprises a method of making a semiconductor package that entails the integration of semiconductor device fabrication and organic substrate packaging. More particularly, a semiconductor die is created utilizing a semiconductor device fabrication process and a platform layer is attached to the semiconductor die using a high temperature bonding process that would otherwise destroy the organic substrate. The use of an elastomeric adhesive mechanically anchors the semiconductor die subassembly to the organic substrate by sealing the gap between the semiconductor die and the organic substrate. The mechanical anchoring enables the performance of electrical interconnect processing between the semiconductor die and the organic substrate. The assembly is then over molded to encapsulate the semiconductor die subassembly securing it in place within the semiconductor package. The elastomeric adhesive further provides mechanical stress isolation of the semiconductor die subassembly within the completed molded semiconductor package. The resulting semiconductor package is capable of limited thermal excursions without compromise of package integrity due to the mitigation of physical stresses. The methodology permits the resultant combination semiconductor package to retain the high temperature processing capability of, for example, a semiconductor power platform, and additionally achieve the high circuit density of the organic substrate utilizing electric interconnects between the semiconductor die and the organic substrate.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A semiconductor package comprising:
   a substrate having an opening extending through said substrate;
   a semiconductor die subassembly positioned in said opening such that edges of said substrate in said opening surround at least a portion of said semiconductor die subassembly;
   an elastomeric adhesive securing said semiconductor die subassembly in said opening, said elastomeric adhesive being positioned in a gap between said edges of said substrate and an outer perimeter of said portion of said semiconductor die subassembly positioned in said opening;
   electrical interconnects between said substrate and said semiconductor die subassembly; and
   a packaging material encapsulating said substrate, said semiconductor die subassembly, said elastomeric adhesive, and said electrical interconnects.

2. A semiconductor package as claimed in claim 1 wherein said substrate comprises an organic substrate.

3. A semiconductor package as claimed in claim 1 wherein said semiconductor die subassembly comprises a power die.

4. A semiconductor package as claimed in claim 1 wherein said semiconductor die subassembly comprises a platform layer coupled to a semiconductor die, said platform layer being positioned in said opening, and said platform layer being surrounded by said elastomeric adhesive.

5. A semiconductor package as claimed in claim 4 wherein said platform layer comprises a metal platform bonded to said semiconductor die using a high temperature bonding process performed prior to placement of said semiconductor die subassembly in said opening.

6. A semiconductor package as claimed in claim 1 wherein said elastomeric adhesive comprises a silicone based material.

7. A semiconductor package as claimed in claim 1 wherein said elastomeric adhesive is positioned in said gap prior to providing said electrical interconnects between substrate and said semiconductor die subassembly.

8. A semiconductor package comprising:
   a substrate having an opening extending through said substrate;
   a semiconductor die subassembly positioned in said opening such that edges of said substrate in said opening surround at least a portion of said semiconductor die subassembly;
   an elastomeric adhesive securing said semiconductor die subassembly in said opening, said elastomeric adhesive being positioned in a gap between said edges of said substrate and an outer perimeter of said portion of said semiconductor die subassembly positioned in said opening; and
   a packaging material encapsulating said substrate, said semiconductor die subassembly, and said elastomeric adhesive.

9. A semiconductor package as claimed in claim 8 wherein:
   said substrate comprises an organic substrate; and
   said semiconductor die subassembly comprises a power die.

10. A semiconductor package as claimed in claim 9 wherein said semiconductor die subassembly further comprises a platform layer positioned in said opening and coupled with said power die, said platform layer being surrounded by said elastomeric adhesive.

11. A semiconductor package as claimed in claim 10 wherein said platform layer comprises a heat sink platform for said power die.

12. A semiconductor package as claimed in claim 10 wherein said platform layer underlies said power die.

13. A semiconductor package as claimed in claim 8 wherein said semiconductor die subassembly includes a semiconductor die, said semiconductor package further comprises electrical interconnects between said substrate and said semiconductor die, and said packaging material additionally encapsulates said electrical interconnects.

14. A semiconductor package comprising:
   an organic substrate having an opening extending through said substrate;
   a semiconductor die subassembly including a power die and a heat sink platform positioned in said opening and coupled with said power die, said heat sink platform underlying said power die, wherein a size of said opening in said organic substrate is larger than said heat sink platform such that a gap is formed between edges of said substrate in said opening and a perimeter of said heat sink platform;
   an elastomeric adhesive positioned in said gap securing said heat sink platform in said opening; and
   a packaging material encapsulating said substrate, said semiconductor die subassembly, and said elastomeric adhesive.

15. A semiconductor package as claimed in claim 14 further comprising electrical interconnects between said substrate and said power die, and said packaging material additionally encapsulates said electrical interconnects.

* * * * *